US009564557B2

(12) United States Patent
Weiler et al.

(10) Patent No.: US 9,564,557 B2
(45) Date of Patent: Feb. 7, 2017

(54) LED BASED DEVICE WITH WIDE COLOR GAMUT

(71) Applicant: KONINKLIJKE PHILIPS N.V., Eindhoven (NL)

(72) Inventors: Volker Weiler, Eindhoven (NL); Peter Josef Schmidt, Eindhoven (NL); Hans-Helmut Bechtel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 68 days.

(21) Appl. No.: 14/439,253

(22) PCT Filed: Oct. 22, 2013

(86) PCT No.: PCT/IB2013/059535
§ 371 (c)(1),
(2) Date: Apr. 29, 2015

(87) PCT Pub. No.: WO2014/068440
PCT Pub. Date: May 8, 2014

(65) Prior Publication Data
US 2015/0295144 A1    Oct. 15, 2015

Related U.S. Application Data

(60) Provisional application No. 61/721,284, filed on Nov. 1, 2012.

(51) Int. Cl.
*H01L 33/50* (2010.01)
*C09K 11/64* (2006.01)
(Continued)

(52) U.S. Cl.
CPC ........... *H01L 33/502* (2013.01); *C09K 11/617* (2013.01); *C09K 11/646* (2013.01);
(Continued)

(58) Field of Classification Search
CPC ............... C09K 11/7734; H01L 33/502; G02F 1/133603
See application file for complete search history.

(56) References Cited

U.S. PATENT DOCUMENTS 6,513,949 B1 * 2/2003 Marshall ............. H01L 25/0753
257/E25.02
7,847,309 B2 * 12/2010 Radkov ................ C09K 11/675
252/301.4 R (Continued)

FOREIGN PATENT DOCUMENTS

EP   2432037 A1   4/2012
WO   0033390     6/2000

(Continued)

OTHER PUBLICATIONS

"Luminescent Materials" Blasse et al, 1994 ISBN 3-540-58019-0, Chapters 1, 6, 10.

*Primary Examiner* — Elmito Breval

(57) ABSTRACT

The invention provides a lighting unit comprising a source of blue light, a source of green light, a first source of red light comprising a first red luminescent material, configured to provide red light with a broad band spectral light distribution, and a second source of red light comprising a second red luminescent material, configured to provide red light with a spectral light distribution comprising one or more red emission lines. Especially, the first red luminescent material comprises $(Mg,Ca,Sr)AlSiN_3$:Eu and/or $(Ba,Sr,Ca)_2Si_{5-x}Al_xO_xN_{8-x}$:Eu, and the second red luminescent material comprises $K_2SiF_6$:Mn.

15 Claims, 8 Drawing Sheets

(51) Int. Cl.
*C09K 11/77* (2006.01)
*C09K 11/61* (2006.01)
*G02F 1/1335* (2006.01)
*H01L 25/075* (2006.01)

(52) U.S. Cl.
CPC ...... *C09K 11/7731* (2013.01); *C09K 11/7734* (2013.01); *G02F 1/133603* (2013.01); *H01L 25/0753* (2013.01); *H01L 33/504* (2013.01); *G02F 2001/133614* (2013.01); *H01L 2924/0002* (2013.01)

(56) References Cited

U.S. PATENT DOCUMENTS

| | | |
|---|---|---|
| 2004/0144955 A1 | 7/2004 | Chau |
| 2006/0169998 A1 | 8/2006 | Radkov et al. |
| 2007/0205712 A1 | 9/2007 | Radkov |
| 2009/0231832 A1 | 9/2009 | Zukauskas |
| 2010/0079058 A1 | 4/2010 | Schmidt |
| 2010/0127286 A1* | 5/2010 | Schmidt ............. C09K 11/0883 257/98 |
| 2012/0155076 A1* | 6/2012 | Li ........................ F21V 9/16 362/231 |
| 2012/0161170 A1* | 6/2012 | Dubuc .................. A01G 7/045 257/89 |

FOREIGN PATENT DOCUMENTS

| | | |
|---|---|---|
| WO | 2004036962 A1 | 10/2003 |
| WO | 2005083037 A1 | 9/2005 |
| WO | 2012084451 A1 | 6/2012 |

\* cited by examiner

US 9,564,557 B2

LED BASED DEVICE WITH WIDE COLOR GAMUT

CROSS-REFERENCE TO PRIOR APPLICATIONS

This application is the U.S. National Phase application under 35 U.S.C. §371 of International Application No. PCT/IB2013/059535, filed on Oct. 22, 2013, which claims the benefit of U.S. Patent Application No. 61/721,284, filed on Nov. 1, 2012. These applications are hereby incorporated by reference herein.

FIELD OF THE INVENTION

The invention relates to a lighting unit which can generate light with a wide color gamut. The invention further relates to a LCD display device comprising such lighting unit as backlighting unit.

BACKGROUND OF THE INVENTION

Green luminescent materials for LED (light emitting device) applications are known in the art. The international patent application WO/2004/036962, for instance, describes a light emitting device comprising a light emitting structure capable of emitting primary light of a wavelength less than 480 nm and a luminescent screen comprising a phosphor of general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$. Further, WO/2004/030109 describes an UV-blue excitable green luminescent material consisting of a Eu-doped oxynitride host lattice with general composition $MSi_2O_2N_2$, wherein M is at least one of an alkaline earth metal chosen from the group Ca, Sr, Ba.

SUMMARY OF THE INVENTION

Current phosphor converted (pc-) LED solutions appear to suffer either from lacking intensity in the red spectral region, which forbids the manufacture of warm white devices (CCT<5000K) and limits color rendition properties, or they have to use phosphors which have a substantial portion of the emitted energy at wavelengths >650 nm and hamper the luminous efficiency (lm/W) of such devices due to the limited eye sensitivity in the deep red spectral region. The latter phosphors are usually band emitting materials based on activation by Eu(II) (i.e. divalent europium). With this activator, spectral bandwidth expressed as the full width half maximum (FWHM) of the emission spectrum is intrinsically limited to about 50 nm at the needed emission wavelengths (peak maximum >600 nm). Thus for pc-LEDs luminescent materials with narrow band or line emission in the red spectral region are very desirable as they will offer increased spectral efficiency for illumination purposes. In displays such materials with saturated red color points lead to a wider color gamut if used e.g. in LEDs for LCD backlights.

It was found that for phosphor-converted light emitting diodes (pc-LED) luminescent materials with narrow band or line emission are very desirable. They appear to offer increased spectral efficiency and significantly increased color gamut in the green and red spectral area if applied for display backlighting devices (improved color separation & saturation). However, using state-of-the-art green and red phosphors like rare-earth-doped YAG and Eu doped $CaAlSiN_3$ only a limited color gamut can be achieved.

Hence, it is an aspect of the invention to provide an alternative lighting unit, configured to use an alternative phosphor combination, which may provide a wide color gamut. It is also an aspect of the invention to provide an alternative LCD display device, comprising such lighting unit configured as backlighting device (and including one or more color filters). It is further an aspect of the invention to provide a combination of phosphors that may be applied in an embodiment of the lighting unit.

In a first aspect, the invention provides a lighting unit comprising a source of blue light, a source of green light, a first source of red light comprising a first red luminescent material, configured to provide red light with a broad band spectral light distribution, and a second source of red light comprising a second red luminescent material, configured to provide red light with a spectral light distribution comprising one or more red emission lines.

In a specific embodiment, the lighting unit includes a phosphor material mix comprising a narrow-red emitting complex fluoride (e.g. $(K,Rb)_2SiF_6:Mn$, such as $K_2SiF_6:Mn$) and an Ln-doped (lanthanide, especially Europium and/or Cerium doped) alkaline earth nitridosilicate (e.g. $(Ba,Sr,Ca,Mg)AlSiN_3:Eu$; especially $(Sr,Ca,Mg)AlSiN_3:Eu$) excited both with a blue LED. In combination with a green LED, a NTSC (National Television System Committee) color gamut of 80% and higher can be achieved by adding red-line emitting Mn-activated fluorides to the broad emitting $(Ba,Sr,Ca,Mg)AlSiN_3:Eu$ phosphor, especially $(Sr,Ca,Mg)AlSiN_3:Eu$ phosphor.

In yet another specific embodiment, a pc-pink LED is applied. The pc-pink LED device comprises a blue LED and a red-emitting phosphor mixture comprising of broad-emitting red luminescent material (such as $(Ba,Sr,Ca,Mg)AlSiN_3:Eu$, especially $(Sr,Ca,Mg)AlSiN_3:Eu$) and an additional narrow-red emitter (like Mn-doped $K_2SiF_6$). The red phosphor mixture has a strong and broad absorption in the region of about 455 nm excitable by the blue LED. Simulations of such phosphor layers with blue and green LEDs (centered at about 455 nm and 530 nm, respectively) reveal a significant improvement of the NTSC color gamut ($\geq 80\%$ and higher). The simulation is supported by measured data of prepared phosphor layers matching quite well with the simulation.

In yet a further aspect, the invention provides an LCD display device comprising the lighting unit as defined herein, configured as backlighting unit. Due to the large color gamut, a wide range of colors can be displayed by the LCD display device. As will be clear to the person skilled in the art, such LCD display device may further include one or more color filters, especially arranged downstream of the backlighting unit (but upstream of a display of the LCD display device).

In yet a further aspect, the invention provides a combination of phosphors comprising a green luminescent material selected from the group consisting of a divalent europium containing oxynitride, a divalent europium containing thiogallate, a trivalent cerium containing nitride, a trivalent cerium containing oxynitride, and a trivalent cerium containing garnet, a first red luminescent material, selected from the group consisting of $(Ba,Sr,Ca,Mg)AlSiN_3:Eu$ and $(Ba,Sr,Ca)_2Si_{5-x}Al_xO_xN_{8-x}:Eu$, with x being in the range of 0-4 (such as 0, or 0.5-4, like 1-4, like 2 or 3; even more especially 0-0.4, such as 0-0.2), and a second red luminescent material selected from the group consisting of $M_2AX_6$ doped with tetravalent manganese, wherein M comprises monovalent cations, selected from the group consisting of Li, Na, K, Rb, Cs, $NH_4$, wherein A comprises a tetravalent cation selected from the group consisting of Si, Ti, Ge, Sn, and Zr, and wherein X comprises a monovalent anion selected from the group consisting of F, Cl, Br and I, but at least comprising F (such as especially substantially only F). Note however that to obtain the advantages of the invention in the lighting unit or LCD display device, also other options than this phosphor combination can be applied (see also below).

The lighting unit of the invention can be a lighting unit that is applied for general lighting, but may also be a lighting unit that is applied for e.g. backlighting. A non-limiting number of applications are indicated below. Note that the term "lighting unit" may also relate to a plurality of lighting units.

The lighting unit comprises at least four sources of light. As will be clear to a person skilled in the art, the lighting unit may only generate light (i.e. lighting unit light) when the lighting unit is in operation. The lighting unit will comprise at least one light source that is used as excitation source. This can be e.g. a blue LED, or an UV LED, or a combination of both types of LEDs. The terms "blue LED" or "UV LED" refers to LEDs that are configured to generate, during operation, blue light or UV light, respectively. The choice of the excitation source(s) may depend upon the type of luminescent materials, as is known to the person skilled in the art. When the excitation source comprises a UV LED, the lighting unit may further comprise a blue luminescent material, configured to generate blue light upon excitation by the UV LED light source. Note that one or more other luminescent materials may be configured to be excited by the UV light directly and/or by the blue light of the blue luminescent material. Note again that the terms "light source" and "LED" may also relate to a plurality of light sources and LEDs, respectively. For instance, when the source of green light (see also below) comprises a luminescent material, the blue LED may be configured to excite the green luminescent material and the first red luminescent material and the second luminescent material. Different configurations may be chosen, including e.g. a pc-LED with only the green luminescent material and a pc-LED with only the red luminescent material(s), but also combinations of luminescent materials may be applied, either on the LED (including in a resin), or remote (i.e. at a non-zero distance) from the LED(s), e.g. as a coating on an exit window or embedded in a transmissive window. A pc-LED, with a blue LED, with only the red luminescent material(s) that are excitable by the blue LED, is herein also indicated as pink LED. The term "blue luminescent material" may in embodiments also relate to a plurality of blue luminescent materials. The term light source may in principle relate to any light source known in the art, but may especially refer to a LED-based light source, herein further indicated as LED. The description below will—for the sake of understanding—only addresses LED-based light sources.

The light source is configured to provide UV and/or blue light (see above). In a preferred embodiment, the light emitting diode is configured to generate LED light with a blue component. In other words, the light source comprises a blue LED. In yet another embodiment, the light emitting diode is configured to generate LED light with a UV component. In other words, the light source comprises a UV LED. When a UV light source is applied, and blue or white light is desired, as blue component, for instance the well-known material $BaMgAl_{10}O_{17}:Eu^{2+}$ might be applied. However, also other luminescent materials that are able to convert UV light into blue light may alternatively or additionally be applied. Preferably, the light source is a light source that during operation emits at least light at a wavelength selected from the range of 200-490 nm, especially a light source that during operation emits at least light at wavelength selected from the range of 400-490 nm, even more especially in the range of 440-490 nm. This light may partially be used by the luminescent material(s) (see below). In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs. Hence, in a specific embodiment, the light source is configured to generate blue light.

The term "white light" herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high correlated color temperature may be that there may be a relative high blue component in the light source light.

Hence, the lighting unit especially comprises a light source which may be one or more of a UV LED and a blue LED. The former in combination with a blue luminescent material, configured to convert at least part of the UV (LED) light into blue light, may provide the source of blue light. Especially, a blue LED is applied, especially having a centroid emission in the above indicated wavelength range(s), especially 440-490 nm. Hence, in an embodiment the source of blue light comprises a blue light emitting diode (LED). The term "source of blue light" may also relate to a plurality of sources of blue light.

As the source of blue light may comprise one or more of (a) a UV LED, in combination with a blue luminescent material, and (b) a blue LED, the source of green light may comprise one or more of a UV LED in combination with a green luminescent material (configured to convert at least part of the UV (LED) light into green light), a blue LED in combination with a green luminescent material (configured to convert at least part of the blue (LED) light into green light), and a green LED. As will be clear from the above, also combinations of two or more of those sources of green light may be applied. Further, a green luminescent material may be applied that converts at least part of the blue light of a blue luminescent material (when such blue luminescent material is applied).

The term "source of green light" may also relate to a plurality of sources of green light. The term "green luminescent material" may in embodiments also relate to a plurality of green luminescent materials. In a specific embodiment, the source of green light comprises a luminescent material that is configured to convert at least part of the blue light of the source of blue light, and to convert said blue light into green light.

As indicated above, the source of green light may include a green luminescent material that converts at least part of a light source light, such as a blue LED, into green light (during operation). Especially, the (green) luminescent material may comprise one or more phosphors selected from the group consisting of a trivalent cerium containing garnet and a trivalent cerium containing oxynitride. Hence, in an embodiment the source of green light comprises a luminescent material comprising $M_3A_5O_{12}:Ce^{3+}$, wherein M is selected from the group consisting of Sc, Y, Tb, Gd, and Lu and wherein A is selected from the group consisting of Al and Ga. Especially, M at least comprises one or more of Y and Lu, and wherein A at least comprises Al. These types of materials may give highest efficiencies. In a specific embodiment, the second red luminescent material comprises at least two luminescent materials of the type of $M_3A_5O_{12}:Ce^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3+}$. Embodiments of garnets especially include $M_3A_5O_{12}$ garnets, wherein M comprises at least yttrium or lutetium and wherein A comprises at least aluminium. Such garnet may be doped with cerium (Ce), with praseodymium (Pr) or a combination of cerium and praseodymium; especially however with Ce. Especially, A comprises aluminium (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3B_5O_{12}:Ce$, wherein x is equal to or larger than 0 and equal to or smaller than 1. The term ":Ce" or ":Ce$^{3+}$", indicates that part of the metal ions (i.e. in the garnets: part of the "M" ions) in the luminescent material is replaced by Ce. For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

In a specific embodiment, the source of green light comprises a LED with centroid emission wavelength in the range of 510-540 nm.

The sources of red light in general always include two (or more) different luminescent materials. The first red luminescent material provides, upon excitation with light a broad band luminescence, which is at least in part of the red region of the spectrum. The second red luminescent material provides, upon excitation with light a spectrum with one or more lines. Characteristic luminescent species that generate line emissions are lanthanides (f-f transitions, like $Pr^{3+}$, $Sm^{3+}$ and $Eu^{3+}$), chromium ($^2E$ line emission) and tetravalent manganese (also $^2E$ emission). Especially, the second red luminescent material is based on tetravalent manganese (MnIV).

Hence, the source of red light, irrespective whether this includes the first red luminescent material or second luminescent material, may comprise one or more of a UV LED in combination with a red luminescent material (configured to convert at least part of the UV (LED) light into red light), and a blue LED in combination with a red luminescent material (configured to convert at least part of the blue (LED) light into red light). As will be clear from the above, also combinations of two or more of those sources of red light may be applied. Further, a red luminescent material may be applied that converts at least part of the blue light of a blue luminescent material (when such blue luminescent material is applied). Note that a single light source may be used to excite all luminescent materials. However, also embodiments are included wherein a subset of one or more light sources are configured to provide, together with the first red luminescent material and/or the second red luminescent material, the red light, and another subset of one or more light sources are configured to provide blue and/or (optionally together with a green luminescent material) green light (see also above).

Examples of broad band emitters, narrow band emitters, and line emitters are for instance described by G. Blasse and B. C. Grabmaier, Luminescent Materials, Springer-Verlag Berlin Heidelberg 1994, especially chapters 1-6 and 10 (ISBN 3-540-58019-0/ISBN 0-387-58019-0).

The term "(first or second) source of red light", and similar terms, may also relate to a plurality of (first or second) sources of red light, respectively. The term "first red luminescent material" may in embodiments also relate to a plurality of first red luminescent materials. Likewise, the term "second red luminescent material" may in embodiments also relate to a plurality of second red luminescent materials.

It especially appears that a broad band red emitting material with a centroid wavelength above about 590 nm and with a relative broad bandwidth may provide good results. Hence, in an embodiment the first source of red light is configured to provide red light with a broad band spectral light distribution having a centroid emission wavelength ≥590 nm and with a full width half maximum (FWHM) of ≥70 nm (but especially ≤130 nm). Broad band emitters are often systems that have a Stokes shift, as known in the art. Herein, the term "centroid wavelength" and "full width half maximum" especially relate to values that can be derived from emission spectra on a wavelength scale and in energy (such as W/nm). The term "centroid wavelength", is known in the art, and refers to the wavelength value where half of the light energy is at shorter and half the energy is at longer wavelengths; the value is stated in nanometers (nm). It is a spectral average of the intensity over the wavelength ($\Sigma \lambda^* I_\lambda / \Sigma I$); i.e. the integration of the intensity over the emission band normalized to the integrated intensity). Centroid wavelength and full width half maximum are, as usual, determined at room temperature (especially 20° C.) of the respective luminescent material.

Red light emitting luminescent materials that have broad band emissions are especially divalent europium containing materials. Hence, in a specific embodiment, the first source of red light comprises said first red luminescent material selected from the group consisting of a divalent europium containing sulfide, a divalent europium containing nitride and a divalent europium containing oxynitride. Hence, in an embodiment, the first red luminescent material is selected from the group consisting of a divalent europium containing sulfide, a divalent europium containing nitride and a divalent europium containing oxynitride. Especially, the first red luminescent material is selected from the group consisting of (Ba,Sr,Ca,Mg)AlSiN$_3$:Eu (especially (Sr,Ca,Mg)AlSiN$_3$: Eu) and (Ba,Sr,Ca)$_2$Si$_{5-x}$Al$_x$O$_x$N$_{8-x}$:Eu (with x as indicated above). In these compounds, europium (Eu) is substantially or only divalent, and replaces one or more of the indicated divalent cations.

In general, Eu will not be present in amounts larger than 10% of the cation, especially in the range of about 0.5-10%, more especially in the range of about 0.5-5% relative to the cation(s) it replaces. The term ":Eu" or ":Eu$^{2+}$", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$) AlSiN$_3$. Divalent europium will in general replace divalent cations, such as the above divalent alkaline earth cations, especially Mg, Ca, Sr, and Ba, even more especially Ca, Sr or Ba.

Further, the material (Ba,Sr,Ca)$_2$Si$_{5-x}$Al$_x$O$_x$N$_{8-x}$:Eu (with x as indicated above) can also be indicated as M$_2$Si$_{5-x}$Al$_x$O$_x$N$_{8-x}$:Eu, wherein M is one or more elements selected from the group consisting of barium (Ba), strontium (Sr) and calcium (Ca); especially, in an embodiment M comprises in this compound Sr and/or Ba. Hence, the term "(Ba,Sr,Ca)" and similar terms, may indicate that one or more of Ba, Sr and Ca are present in the compound (on the M position(s)). In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu, (i.e. 75% Ba; 25% Sr). Here, Eu is introduced and replaces at least part of M i.e. one or more of Ba, Sr, and Ca).

Likewise, the material (Ba,Sr,Ca,Mg)AlSiN$_3$Eu can also be indicated as MAlSiN$_3$Eu$_5$ wherein M is one or more elements selected from the group consisting of barium (Ba), strontium (Sr), calcium (Ca) and magnesium (Mg); especially, M comprises in this compound calcium or strontium, or calcium and strontium, more especially calcium. Here, Eu is introduced and replaces at least part of M (i.e. one or more of Mg, Ba, Sr, and Ca). Preferably, in an embodiment the first red luminescent material comprises (Ca,Sr,Mg)AlSiN$_3$: Eu, preferably CaAlSiN$_3$:Eu. Further, in another embodiment, which may be combined with the former, the first red luminescent material comprises (Ca,Sr,Ba)$_2$Si$_{5-x}$Al$_x$O$_x$N$_{8-x}$: Eu, preferably (Sr,Ba)$_2$Si$_5$N$_8$:Eu. The terms "(Ca,Sr,Ba)" indicate that the corresponding cation may be occupied by one or more of calcium, strontium or barium. It also indicates that in such material corresponding cation sites may be occupied with cations selected from the group consisting of calcium, strontium and barium. Thus, the material may for instance comprise calcium and strontium, or only strontium, etc. In an analogous way, this applies for other terms (with such cation(s)).

Hence, in an embodiment the first red luminescent material may further comprises M$_2$Si$_5$N$_8$:Eu$^{2+}$, wherein M is selected from the group consisting of Ca, Sr and Ba, even more especially wherein M is selected from the group consisting of Sr and Ba. In yet another embodiment, which may be combined with the former, the first red luminescent material may further comprise MAlSiN$_3$:Eu$^{2+}$, wherein M is selected from the group consisting of Mg, Ca, Sr, and Ba, even more especially wherein M is selected from the group consisting of Sr and Ca.

It further especially appears that a (second) red line emitting material with a centroid wavelength above about 610 nm and with a relative narrow bandwidth may provide good results, such as especially the above indicated tetravalent manganese containing systems. Especially, the second source of red light is configured to provide red light with a spectral light distribution comprising one or more red emission lines having a centroid emission wavelength ≥610 nm and with one or more red emission lines having a full width half maximum (FWHM) of ≤50 nm.

A specific example of such second red luminescent material is of the type M$_2$AX$_6$ doped with Mn$^{4+}$ (i.e. at the A position). Especially, the second source of red light comprises said first red luminescent material selected from the group consisting of M$_2$AX$_6$ doped with tetravalent manganese, wherein M comprises monovalent cations, selected from the group consisting of Li, Na, K, Rb, Cs, NH$_4$, especially at least comprising potassium (K), wherein A comprises a tetravalent cation selected from the group consisting of Si, Ti, Ge, Sn, and Zr, especially at least comprising silicon (Si), and wherein X comprises a monovalent anion selected from the group consisting of F, Cl, Br and I, but at least comprising F (and especially substantially only comprising F). In this context, the phrase "at least comprising" especially refers to embodiments wherein the specific species may comprise one or more of the indicated species, but at least the species that is indicated with "at least comprising". To give an example, when M at least comprises K, this may imply embodiments wherein the species or monovalent cation M (or the host lattice position(s) of M) include >0% of the K, up to 100%. Hence, e.g. the following embodiments are included: (K$_{0.01}$Rb$_{0.99}$)$_2$SiF$_6$:Mn, RbKSiF$_6$:Mn, and K$_2$SiF$_6$:Mn, etc. etc. In an embodiment, M comprises K and/or Rb (i.e. (Rb,K)$_2$SiF$_6$:Mn.

As known in the art, the phrase "M$_2$AX$_6$ doped with Mn$^{4+}$" can also be indicated as M$_2$AX$_6$:Mn$^{4+}$. Here, The term ":Mn" or ":Mn$^{4+}$", indicates that part of the tetravalent A ions is replaced by tetravalent Mn. The term "tetravalent manganese" refers to Mn$^{4+}$. This is a well-known luminescent ion. In the formula as indicated above, part of the tetravalent cation A (such as Si) is being replaced by manganese. Hence, M'$_x$M$_{2-2x}$AX$_6$ doped with tetravalent manganese may also be indicated as M'$_x$M$_{2-2x}$A$_{1-m}$Mn$_m$X$_6$. The mole percentage of manganese, i.e. the percentage it replaces the tetravalent cation A will in general be in the range of 0.1-15%, especially 1-12%, i.e. m is in the range of 0.001-0.15, especially in the range of 0.01-0.12.

A comprises a tetravalent cation, and especially at least comprises silicon. A may optionally further comprise one or more of titanium (Ti), germanium (Ge), stannum (Sn) and zinc (Zn). Preferably, at least 80%, even more preferably at least 90%, such as at least 95% of M consists of silicon. Hence, in a specific embodiment, M$_2$AX$_6$ may also be described as M$_2$A$_{1-m-t-g-s-zr}$Mn$_m$Ti$_t$Ge$_g$Sn$_s$Zr$_{Zr}$X$_6$, wherein m is as indicated above, and wherein t, g, s, zr are each individually preferably in the range of 0-0.2, especially 0-0.1, even more especially 0-0.05, wherein t+g+s+zr is smaller than 1, especially equal to or smaller than 0.2, preferably in the range of 0-0.2, especially 0-0.1, even more especially 0-0.05, and wherein A is especially Si.

As indicated above, M relates to monovalent cations, but especially at least comprises one or more of potassium and rubidium. Other monovalent cations that may further be comprised by M can be selected from the group consisting of lithium (Li), sodium (Na), cesium (Cs) and ammonium (NH$_4^+$). Preferably, at least 80%, even more preferably at least 90%, such as 95% of M consists one or more of potassium and rubidium. In a specific embodiment, $M_2AX_6$ can also be described $(K_{1-r-l-n-c-nh}Rb_rLi_lNa_nCs_c(NH_4)_{nh})_2AX_6$, wherein r is in the range of 0-1 (and wherein the ratio potassium-rubidium is preferably as indicated before), wherein l, n, c, nh are each individually preferably in the range of 0-0.2, especially 0-0.1, even more especially 0-0.05, and wherein l+n+c+nh is smaller than 1, especially equal to or smaller than 0.2, preferably in the range of 0-0.2, especially 0-0.1, even more especially 0-0.05. Hence, the invention also provides $(K_{1-r-l-n-c-nh}Rb_rLi_lNa_nCs_c(NH_4)_{nh})_2AX_6$:Mn and similar narrow bad luminescent materials. A is herein especially Si.

As indicated above, X relates to a monovalent anion, but at least comprises fluorine. Other monovalent anions that may optionally be present may be selected from the group consisting of chlorine (Cl), bromine (Br), and iodine (I). Preferably, at least 80%, even more preferably at least 90%, such as 95% of X consists of fluorine. Hence, in a specific embodiment, $M_2AX_6$ can also be described $M_{2A}(F_{1-cl-b-i}Cl_{cl}Br_bI_i)_6$, wherein cl, b, i are each individually preferably in the range of 0-0.2, especially 0-0.1, even more especially 0-0.05, and wherein cl+b+i is smaller than 1, especially equal to or smaller than 0.2, preferably in the range of 0-0.2, especially 0-0.1, even more especially 0-0.05.

Hence, $M_2AX_6$ can also be described $(K_{1-r-l-n-c-nh}Rb_rLi_l-Na_nCs_c(NH_4)_{nh})_2Si_{1-m-t-g-s-zr}Mn_mTi_tGe_gSn_sZr_{Zr}(F_{1-cl-b-i}Cl_{cl}Br_bI_i)_6$, with the values for r, l, n, c, nh, m, t, g, s, zr, cl, b, i as indicated above. Hence, the invention also provides $(K_{1-r-l-n-c-nh}Rb_rLi_lNa_nCs_c(NH_4)_{nh})_2Si_{1-m-t-g-s-zr}Mn_mTi_tGe_gSn_sZr_{Zr}(F_{1-cl-b-i}Cl_{cl}Br_bI_i)_6$:Mn and similar narrow bad luminescent materials. Especially however, the second source of red light comprises said second red luminescent material comprising $K_2SiF_6$:Mn.

As manganese replaces part of a host lattice ion and has a specific function, it is also indicated as "dopant" or "activator". Hence, the hexafluorosilicate is doped or activated with manganese ($Mn^{4+}$).

In addition or alternative to the manganese containing system, the second source of red light may comprise said second red luminescent material comprising a light converter nano particle material.

Nano particles, such as quantum dots (QDs), have shown to be highly interesting in lighting applications. They could e.g. serve as inorganic phosphor in converting blue light to other colors and have the advantage of a relative narrow emission band and the advantage of color tunable by the size of the QDs to be able to obtain high quality pure white light.

The quantum dots or luminescent nanoparticles, which are herein indicated as light converter nanoparticles, may for instance comprise group II-VI compound semiconductor quantum dots selected from the group consisting of CdS, CdSe, CdTe, ZnS, ZnSe, ZnTe, HgS, HgSe, HgTe, CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be I-V-VI2 semiconductor quantum dots, such as selected from the group consisting of $LiAsSe_2$, $NaAsSe_2$ and $KAsSe_2$. In yet a further embodiment, the luminescent nanoparticles may for instance be a group IV-VI compound semiconductor nano crystals such as SbTe. In a specific embodiment, the luminescent nanoparticles are selected from the group consisting of InP, $CuInS_2$, $CuInSe_2$, CdTe, CdSe, CdSeTe, $AgInS_2$ and $AgInSe_2$. In yet a further embodiment, the luminescent nanoparticles may for instance be one of the group II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

In an embodiment, Cd-free QDs are applied. In a specific embodiment, the light converter nano-particles comprise III-V QDs, more specifically an InP based quantum dots, such as a core-shell InP—ZnS QDs. Note that the terms "InP quantum dot" or "InP based quantum dot" and similar terms may relate to "bare" InP QDs, but also to core-shell InP QDs, with a shell on the InP core, such as a core-shell InP—ZnS QDs, like a InP—ZnS QDs dot-in-rod.

The luminescent nanoparticles (without coating) may have dimensions in the range of about 2-50 nm, especially 2-20 nm, such as 5-15 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 5-15 nm). The term "dimensions" especially relate to one or more of length, width, and diameter, dependent upon the shape of the nanoparticle.

In an embodiments, the light converter nanoparticles have an average particle size in a range from about 1 to about 1000 nanometers (nm), and preferably in a range from about 1 to about 100 nm. In an embodiment, nanoparticles have an average particle size in a range from about 1-50 nm, especially 1 to about 20 nm, and in general at least 1.5 nm, such as at least 2 nm. In an embodiment, nanoparticles have an average particle size in a range from about 1 to about 20 nm.

Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or $CuInSe_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided.

Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. For instance, core-shell particles and dots-in-rods may be applied and/or combinations of two or more of the afore-mentioned nano particles may be applied, such as CdS and CdSe. Here, the term "different types" may relate to different geometries as well as to different types of semiconductor luminescent material. Hence, a combination of two or more of (the above indicated) quantum dots or luminescent nano-particles may also be applied.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating may comprise at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

Especially, the overcoating comprises at least one semiconductor material which is different from the composition of the core; i.e. it has a different composition than the composition of the core.

In an embodiment, the surrounding "shell" material can have a band gap greater than the band gap of the core material. In certain other embodiments, the surrounding shell material can have a band gap less than the band gap of the core material.

In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific light converter nanoparticles, based on semiconductors.

Hence, the above-mentioned outer surface may be the surface of a bare quantum dot (i.e. a QD not comprising a further shell or coating) or may be the surface of a coated quantum dot, such as a core-shell quantum dot (like core-shell or dot-in-rod), i.e. the (outer) surface of the shell.

Therefore, in a specific embodiment, the light converter nanoparticles are selected from the group consisting of core-shell nano particles, with the cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

In general, the cores and shells comprise the same class of material, but essentially consist of different materials, like a ZnS shell surrounding a CdSe core, etc.

In a specific embodiment, which may provide a relative wide color gamut, the source of blue light comprises a blue light emitting diode (LED), the source of green light comprises a LED with centroid emission wavelength in the range of 510-540 nm, the first source of red light comprises said first luminescent material, selected from the group consisting of (Mg,Ca,Sr,Ba)AlSiN$_3$:Eu (especially (Mg,Ca,Sr) AlSiN$_3$:Eu) and (Ba,Sr,Ca)$_2$Si$_{5-x}$Al$_x$O$_x$N$_{8-x}$:Eu (with x as indicated above), and the second source of red light comprises said second red luminescent material comprising K$_2$SiF$_6$:Mn.

As indicated above, the invention provides in a further aspect a LCD display device comprising the lighting unit according any one of the preceding claims configured as backlighting unit. In yet a further aspect, the invention also provides a combination of phosphors comprising a green luminescent material selected from the group consisting of a divalent europium containing oxynitride, a divalent europium containing thiogallate, a trivalent cerium containing nitride, a trivalent cerium containing oxynitride, and a trivalent cerium containing garnet, a red luminescent material, selected from the group consisting of (Mg,Ca,Sr,Ba) AlSiN$_3$:Eu and (Ba,Sr,Ca)$_2$Si$_{5-x}$Al$_x$O$_x$N$_{8-x}$:Eu (with x as indicated above), and a second red luminescent material selected from the group consisting of $M_2AX_6$ doped with tetravalent manganese, wherein M comprises monovalent cations, selected from the group consisting of Li, Na, K, Rb, Cs, $NH_4$, wherein A comprises a tetravalent cation selected from the group consisting of Si, Ti, Ge, Sn, and Zr, and wherein X comprises a monovalent anion selected from the group consisting of F, Cl, Br and I, but at least comprising F. However, as indicated above, also other combinations are also conceivable.

As also indicated above, the term "luminescent material" may also relate to a plurality of different luminescent materials. The term luminescent material herein especially relates to inorganic luminescent materials. Likewise, this applies to the term "phosphor". These terms are known to the person skilled in the art. Hence, as will be clear to the person skilled in the art, also combinations of phosphors may be applied. Further, as will be clear to the person skilled in the art, optimization of the luminescent material(s) (or phosphors) with respect to one or more of constituting elements, activator concentration, particle size, etc. or optimization with respect to luminescent material combination(s), may be applied to optimize the illumination device.

The light source may be configured in a (light) chamber, with reflective wall(s) (such as coated with a reflective material like $TiO_2$), and a transparent window. In an embodiment, the window is the light conversion layer. In yet a further embodiment, the window comprises the light conversion layer. This layer may be arranged upstream of the window or downstream of the window. In yet a further embodiment, light conversion layers are applied at both sides of the window.

The terms "upstream" and "downstream" relate to an arrangement of items or features relative to the propagation of the light from a light generating means (here the light source), wherein relative to a first position within a beam of light from the light generating means, a second position in the beam of light closer to the light generating means is "upstream", and a third position within the beam of light further away from the light generating means is "downstream".

The luminescent material is configured to convert at least part of the light source light. In order words, one may say that the light source is radiationally coupled to the luminescent material. When the light source comprises a substantially UV light emitting light source, the luminescent material may be configured to convert substantially all light source light that impinges on the luminescent material. In case the light source is configure to generate blue light, the luminescent material may partly convert the light source light. Dependent upon the configuration, a part of the remaining light source light may be transmitted through a layer comprising the luminescent material.

Below, a number of applications of the invention are indicated:
  office lighting systems
  household application systems
  shop lighting systems,
  home lighting systems,
  accent lighting systems,
  spot lighting systems,
  theater lighting systems,
  fiber-optics application systems,
  projection systems,
  self-lit display systems,
  pixelated display systems,
  segmented display systems,
  warning sign systems,
  medical lighting application systems,
  indicator sign systems, and
  decorative lighting systems
  portable systems
  automotive applications
  green house lighting systems As indicated above, the lighting unit may be used as backlighting unit in an LCD display device. Hence, in a further aspect, the invention provides also a LCD display device comprising the lighting unit as defined herein, configured as backlighting unit.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
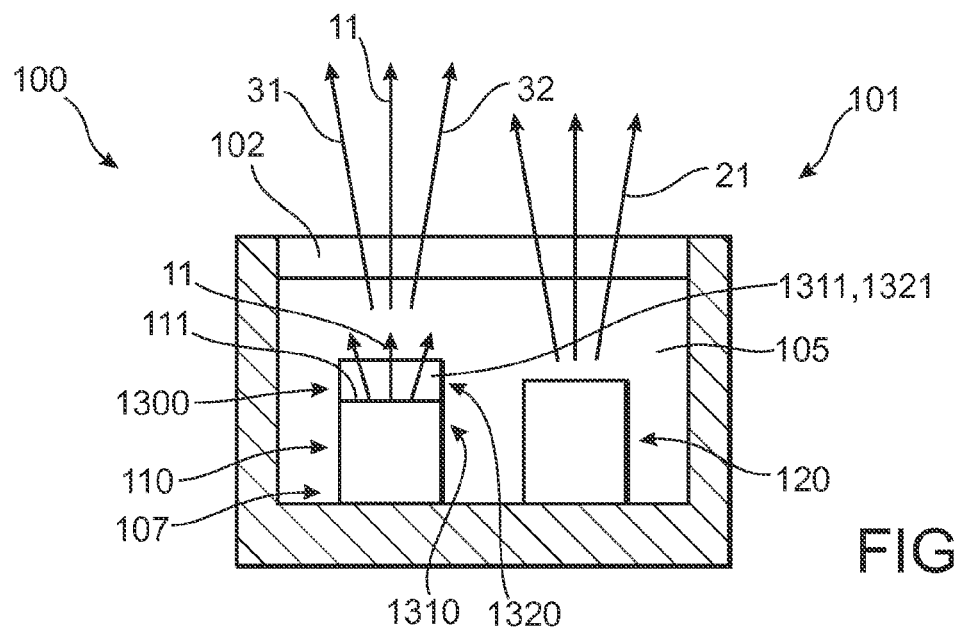
FIGS. 1*a*-1*e* schematically depict some aspects of the invention; these drawings are not necessarily on scale.

FIG. 1*a* schematically depicts an embodiment of a lighting unit 100 as described herein. The lighting unit 100 comprising a light source 107, here a light source of blue light 110 (i.e. a source 110 of blue light; the reference 110 refers to the source; the further indication "of blue light" indicates the nature of the source), a source (of green light) 120, a first source (of red light) 1310 comprising a first red luminescent material 1311, configured to provide red light 31 with a broad band spectral light distribution, and a second source (of red light) 1320 comprising a second red luminescent material 1321, configured to provide red light 32 with a spectral light distribution comprising one or more red emission lines.

Here, in this embodiment, the source of blue light 110 comprises a blue LED. Over this source of blue light 110, such as in a resin on top of the LED die, indicated with reference 111, a light converter 1300 may be arranged. This light converter 1300 may comprise one or more luminescent materials. Here, the light converter 1300 comprises both the first red luminescent material 1311 and the second red luminescent material 1321. These two luminescent material are sources of red light, as they are able to absorb the light source light of the source of blue light 110, and to convert into the broad band red light 31 and the narrow band red light 32. The blue light is indicated with reference 11; the source thereof is indicated with reference 110.

By way of example, in this embodiment the source of green light 120 is shown as LED that is configured to generate green light, indicated with reference 21. This may thus be a LED only, without luminescent material.

Here, the lighting unit comprises a light chamber 105, with a light transmissive window 102. Light from the light sources escape from this window 102, i.e. broad band red light 31, narrow band red light 32, green light 21 and blue light 11. All light escaping from the light exit window or transmissive window 102 is indicated as lighting unit light 101. As indicated above, this light is composed of components, which in combination with a set of RGB filters generate a front of screen (FOS) broad color gamut. The color gamut is defined with the color points resulting for selective transmission of the light from the light source for all color filters, separately.

The blue light source 110 in combination with the two red luminescent materials 1311,1321 is herein also indicated as "the pc-pink LED" (which may thus provide pink light, which is in this embodiment a combination of blue light 11, broad band red light 31, and narrow band red light 32).

Figure 1B:
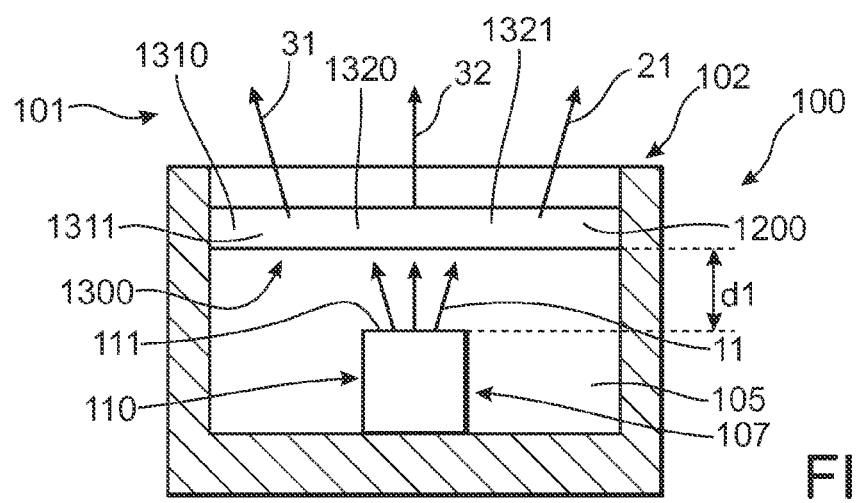

FIG. 1*b* schematically depicts an embodiment wherein the source of blue light 110 is a LED (light source 107 comprises a source 110 configured to provide blue light). This LED is used to provide blue light to the luminescent materials that are provided as upstream layer or coating, to the light transmissive window 102. Hence, in this embodiment the converter 1300 is arranged at a non-zero distance from the LED die 111. This distance is indicated with reference d1 (see further below). The converter 1300 may especially be arranged at a non-zero distance d1 from the light source 110 (or other light source(s)), which may for instance be a light emitting diode, although the distance d may also be zero, for instance when the light converter 1300 is applied on a LED die or embedded in a (silicone) cone on the LED die (see also FIG. 1*c*). The converter 1300 may optionally allow at least part of the light source light 11 penetrate through the converter. In this way, downstream of the converter, a combination of converter light, based on the luminescence(s) of the luminescent material(s) comprised by the light converter 1300, and light source light 11 may be found. The light downstream of the light converter is indicated a lighting device light 101. The distance d1 may especially be in the range of 0.1-100 mm, especially 0.5-100 mm, such as 1-20 mm, like especially 1-50 mm, like about 1-3 for applications close by the light source and 5-50 mm for more remote applications. Note however that the invention is not limited to applications wherein d1>0. The invention, and the herein described specific embodiments, may be also applied in other embodiments with d1=0. In such instances, the light converter may especially be configured in physical contact with the LED die.

Note that the light source 107 might alternatively be a light source configured to provide UV light. In such instance, the lighting unit 100 may be configured to (substantially) prevent light source light downstream of the light exit window/downstream of the convert. For instance, the light converter may be configured to convert substantially all UV light source light into luminescence light of the one or more luminescent materials comprised by the light converter. In this embodiment, the source (of green light) 120 comprises a green luminescent material, indicated with reference 1200. This green luminescent material 1200 provides when being excited the green light 21. The light converter 1300 may further comprise a blue luminescent material, configured to generate blue light upon excitation with the light source light 11.

Alternatively or additionally, the source of blue light 110 comprises a UV LED with a blue luminescent material that at least partly converts the UV light source light into blue light.

Figure 1C:
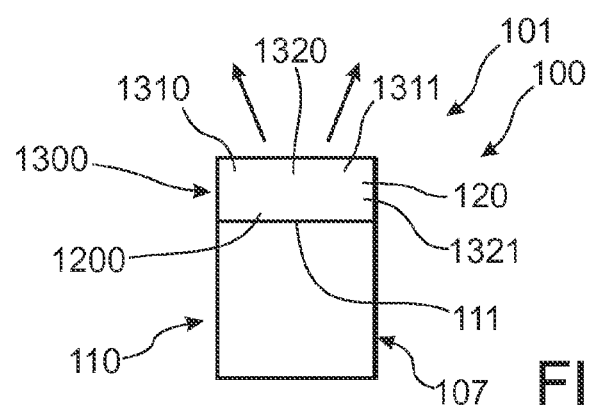

FIG. 1c schematically depicts an embodiment wherein the light converter 1300 is arranged on the LED die 111 of the light source 107. This light source 107 may be a UV LED, or, as depicted, a source of blue light 110, i.e. a blue LED. The converter 1300 in such embodiment comprises a broad band red luminescent material 1311; thereby the first source of red light 1310 (note that this reference refers to the source, which is a source of red light) is provided. Further, the converter 1300 comprises the narrow band red luminescent material 1321. In this way, the second source of red light 1320 is provided; this second source (of red light) 1320 (i.e. the second source of red light 1320) comprises the narrow band luminescent material 1321, which provides when being excited the narrow band red light 32. Here, the converter 1300 also optionally comprises green luminescent material 1200, which provides when being excited the green light 21 (and is thereby also a source 120 of green light).

Note that the above described embodiments may be combined. Further, the invention also relates to alternative arrangements, as will be clear to a person skilled in the art.

Figure 1D:
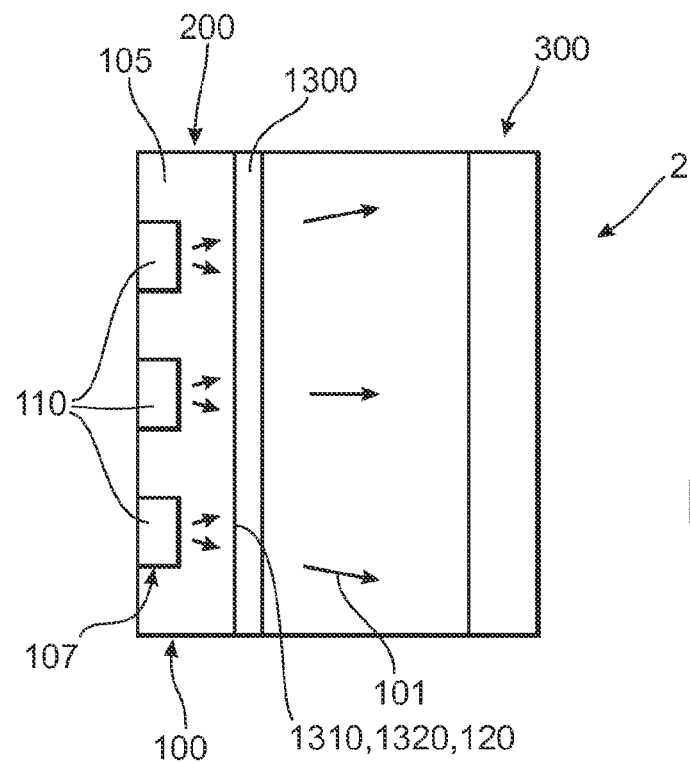

FIG. 1d schematically depicts one of the applications of the lighting unit 100, here in a liquid crystal display device 2, which comprises a back lighting unit 200 which comprises one or more lighting units 100 (here, one lighting unit is schematically depicted), as well as a LCD panel 300, which can be backlighted with the lighting device light 101 of the lighting unit(s) 100 of the back lighting unit 200. Again, by way of example, the light source(s) 107 are sources of blue light 110. In this embodiment, a plurality of such sources 110 is depicted, which are used to excite the luminescent material(s) comprised by the converter 1300. Such LCD display device may further include one or more color filters, especially arranged downstream of the backlighting unit (but upstream of a display of the LCD display device). These filters may filter the (back) lighting device light 101. For the sake of clarity, these filters are not depicted.

Figure 1E:
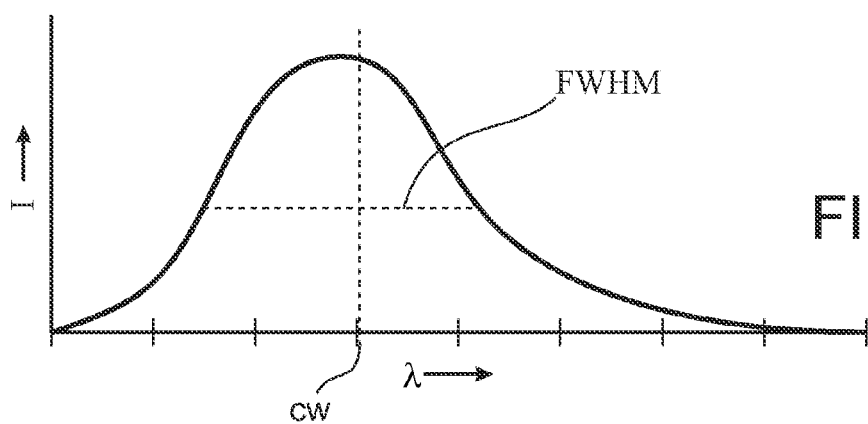

FIG. 1e schematically depicts an emission spectrum of a broad band luminescent material. The FWHM line indicates the middle between the top of the band and the background signal; the reference CW, indicates the wavelength of which left and right of the dotted line at this wavelength, equal intensities are found. This is known as the centroid wavelength.

EXAMPLES

Example 1

The red-emitting phosphor layers necessary for amongst others the pc-pink LED described herein may be obtained by suspending commercially available ECAS $(Sr_{0.8}Ca_{0.2}SiAlN_3:Eu(0.8\%))$ and $K_2SiF_6:Mn$ (prepared as reported by Adachi et al., Journal of Applied Physics 104, 023512, 2008, Direct synthesis and properties of $K_2SiF_6$: $Mn^{4+}$ phosphor by wet chemical etching of Si wafer) in a silicone-based polymer at room temperatures. The well-mixed slurry is tape-casted at a glass substrate and cured at 150° C. for 4 hours in air. The cured layers are about 120 μm in thickness, the filling grade of the phosphor is 20 vol. % in total (18 vol. % $K_2SiF_6:Mn$, 2 vol % ECAS). The measured reflection spectra of the $K_2SiF_6:Mn$ and ECAS powder and the silicone-based layer including 18 vol % $K_2SiF_6:Mn$ and 2 vol. % ECAS is visible in FIG. 2a. The emission spectra of the layer including $K_2SiF_6:Mn$ and ECAS measured is visible in FIG. 2b.

Figure 2A:
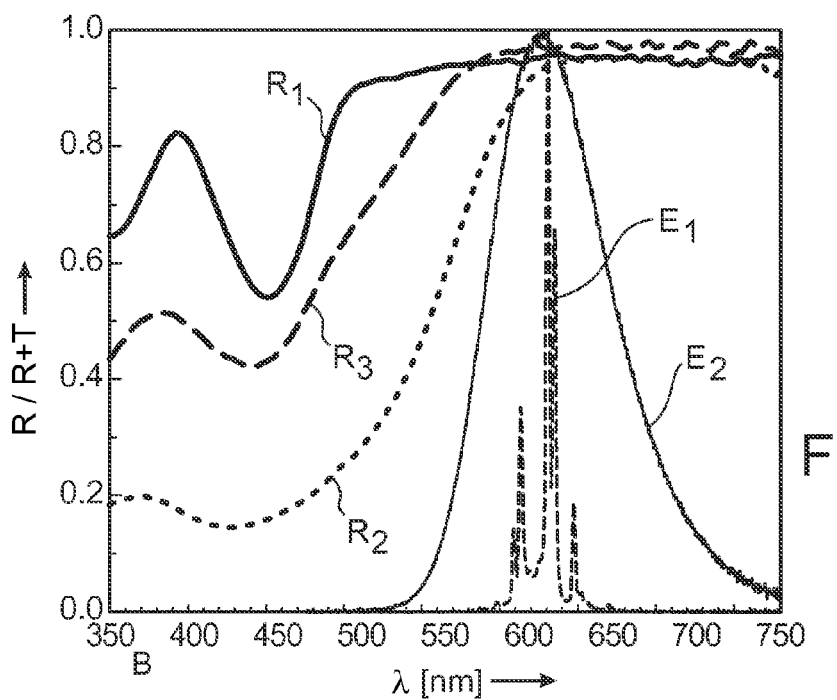
FIG. 2*a*: Reflection and emission spectra of a $K_2SiF_6$: Mn powder (R1,E1), a ECAS powder (R2,E2) and a silicone-based layer including 18 vol. % $K_2SiF_6$:Mn and 2 vol. % ECAS (R3).
Figure 2B:
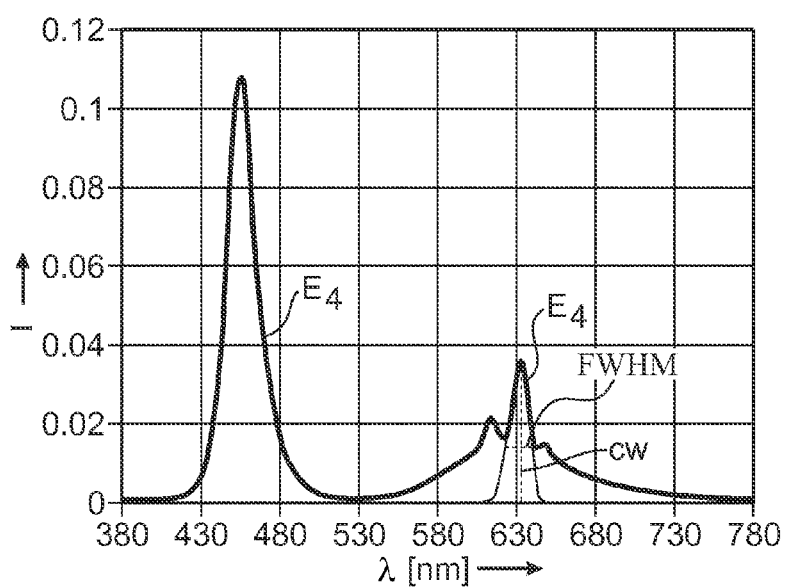
FIG. 2*b* shows the emission spectra (E4) of a blue LED (B) and a silicone-based layer including 18 vol. % $K_2SiF_6$:Mn and 2 vol. % ECAS, The narrow band luminescent material comprises at least one emission line that is beyond 610 nm, and which has the indicated centroid wavelength CW and full width half maximum FWHM.

FIG. 2a shows the reflection and emission spectra of a $K_2SiF_6:Mn$ powder (R1 (i.e. reflection); E1 (i.e. emission)), a ECAS powder (R2;E2) and a silicone-based layer including 18 vol. % $K_2SiF_6:Mn$ and 2 vol. % ECAS (R3). FIG. 2b shows the emission spectra (E4) of a blue LED (B) and a silicone-based layer including 18 vol. % $K_2SiF_6:Mn$ and 2 vol. % ECAS. The narrow band luminescent material comprises at least one emission line that is beyond 610 nm, and which has the indicated centroid wavelength CW and narrow full width half maximum FWHM, which is well below 50 nm (only a few nanometers).

With an additional green LED centered at 530 nm a large color gamut located within NTSC can be obtained.

Hence, the invention provides in an embodiment a phosphor converted LED with one narrow deep red emitting component as MnIV doped $K_2SiF_6$ in combination with a narrow green emitting component with a FWHM ≤50 nm, with another phosphor added to the MnIV component that maximizes the gamut color space coverage for NTSC and sRGB definitions. The light source can therefore consist of:

A: a direct emitting green LED with a peak emission wavelength >510 nm and <540 nm and a pc-LED with two phosphors, one being MnIV doped and the second phosphor having a peak emission between 590 and 630 nm and a FWHM≥70 nm.

B: a three phosphor pcLED with a green phosphor being β-SiAlON or $(Sr,Ca)_{(1-x)}Ga_2S_4:Eu_x$ doped with Eu (0.01<x<0.1), a MnIV doped phosphor and a third phosphor having a peak emission between 590 and 630 nm and a FWHM≥70 nm.

Further Examples for the Application of a Phosphor-Converted Red Phosphor in a LCD Backlight.

Figure 3:
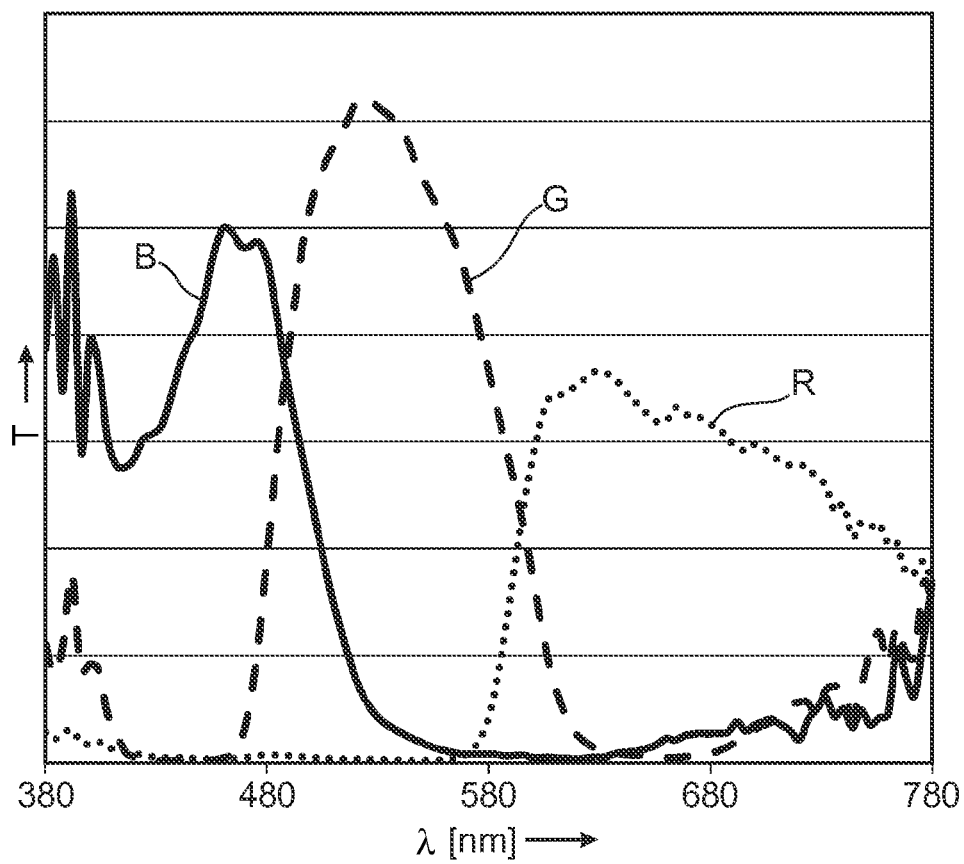
FIG. 3: Transmission functions selected for RGB pixels of a LCD display.

The following example show the Front Of Screen (FOS) performance for a LCD display with one set of RGB color filters shown in FIG. 3, in relation to the spectral composition of a LED backlight unit, with R indicating the red filter, G indicating the green filter and B indicating the blue filter.

First, some reference examples are given: typical pcLED backlight units combine a blue emitting LED with a green emitting and a red emitting phosphor.

Reference Example 1

Green phosphor: LuAG $(Lu_{2.94}Al_5O_{12}: Ce_{0.06})$
Red phosphor: Eu doped $(Sr,Ca)AlSiN_3$ The FOS color gamut in comparison to the sRGB and NTSC definition gamuts together with the color points of the backlight unit and the white FOS color point and the emission spectrum of the backlight unit, for blue LEDs with peak emission at 440, 450, 460 and 470 nm, respectively, were determined:

TABLE 1

Area of the FOS color gamut relative to sRGB and
NTSC definitions and FOS lumen equivalent.

| Blue peak [nm] | sRGB | NTSC | LE [lm/W] | pr_redbroad | pr_green | pr_blue |
|---|---|---|---|---|---|---|
| 440 | 98.29% | 69.62% | 273 | 23.97% | 36.65% | 39.38% |
| 450 | 96.86% | 68.60% | 275 | 27.89% | 36.41% | 35.71% |
| 460 | 91.23% | 64.62% | 264 | 32.34% | 31.27% | 36.39% |
| 470 | 79.69% | 56.44% | 241 | 38.27% | 21.29% | 40.43% |

Herein, pr_redbroad, pr_green, pr_blue, pr_redKSiF (see below) and pr_redQD (see below) are the power fractions for the different emitters. These values add up to 100%.

Reference Example 2

In order to increase the NTSC gamut coverage, a pink emitting LED (blue LED+red phosphor) is combined with a green emitting LED in the range of 520-530 nm peak emission.
Green: direct emitting LED
Red phosphor: Eu doped (Sr,Ca)AlSiN$_3$
Blue LED: 450 nm peak emission
The following data were obtained:

TABLE 2

Area of the FOS color gamut relative to sRGB and NTSC definitions and
FOS lumen equivalent for 450 nm blue LED and different green LEDs.

| Green peak [nm] | sRGB | NTSC | LE [lm/W] | pr_redbroad | pr_green | pr_blue |
|---|---|---|---|---|---|---|
| 510 | 103.73% | 73.47% | 243 | 47.09% | 23.57% | 29.34% |
| 520 | 109.20% | 77.34% | 257 | 45.29% | 22.07% | 32.64% |
| 530 | 109.68% | 77.68% | 270 | 42.38% | 22.50% | 35.12% |
| 540 | 106.30% | 75.29% | 283 | 37.82% | 24.87% | 37.32% |

Compared to the pcLED green backlight unit,

| Blue peak [nm] | sRGB | NTSC | LE [lm/W] |
|---|---|---|---|
| 450 | 96.86% | 68.60% | 275 | nor the color gamut nor the LE increase significantly.

Reference Example 3

Due to the limited cut-off of the red color filter, the NTSC gamut coverage, can only be increased significantly, if a narrow red emitting phosphor is used.

Known materials with the desired properties are MnIV doped fluoride phosphors:
Green: direct emitting LED
Red phosphor: MnIV doped K2SiF6
Blue LED: 450 nm peak emission

TABLE 3

Area of the FOS color gamut relative to sRGB and NTSC definitions and
FOS lumen equivalent for 450 nm blue LED and different green LEDs:

| Green peak [nm] | sRGB | NTSC | LE [lm/W] | pr_green | pr_redKSiF | pr_blue |
|---|---|---|---|---|---|---|
| 510 | 132.14% | 93.59% | 233 | 28.79% | 41.40% | 29.80% |
| 520 | 138.77% | 98.29% | 250 | 26.79% | 39.53% | 33.68% |
| 530 | 136.61% | 96.76% | 265 | 26.89% | 36.54% | 36.57% |
| 540 | 128.58% | 91.07% | 280 | 28.99% | 32.00% | 39.00% |

Now the gamut approaches the area of NTSC definition, but it covers not the same color space. Deficit is a too red color point, generating issues in image color reproduction. Further, the FOS color gamut with backlight units using different direct green emitting LEDs of 510, 520, 530 and 540 nm peak, respectively, were determined.

Example 2

The aim of this invention is—amongst others—to build an LCD backlighting unit with maximum overlap of the FOS color gamut with the NTSC definition.

This is done by combining a direct green emitting LED with a pcLED consisting of a blue LED and two phosphors, one being a Mn(IV) doped phosphor, the other one being Eu doped (Sr,Ca)AlSiN3

FIGS. 4a to 7b show the FOS color gamut in comparison to the sRGB and NTSC definition gamuts together with the backlight emissions.

Figure 4A:
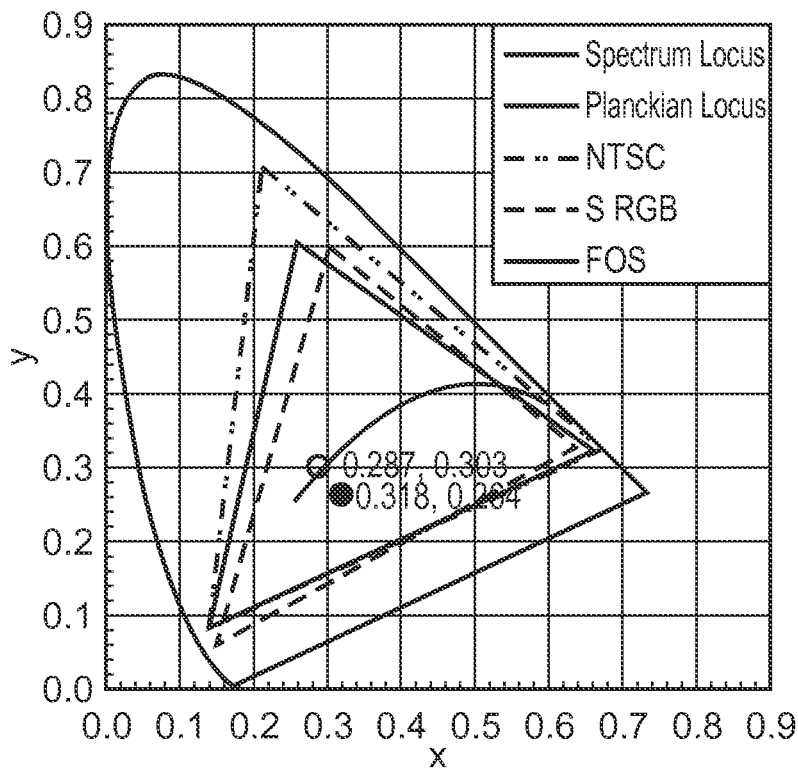
FIGS. 4*a*-4*b*: show with a 510 nm green LED, on the left (a) a chromaticity chart (CIE chromaticity diagram) and on the right 9*b*) an emission spectrum of backlight unit.
Figure 4B:
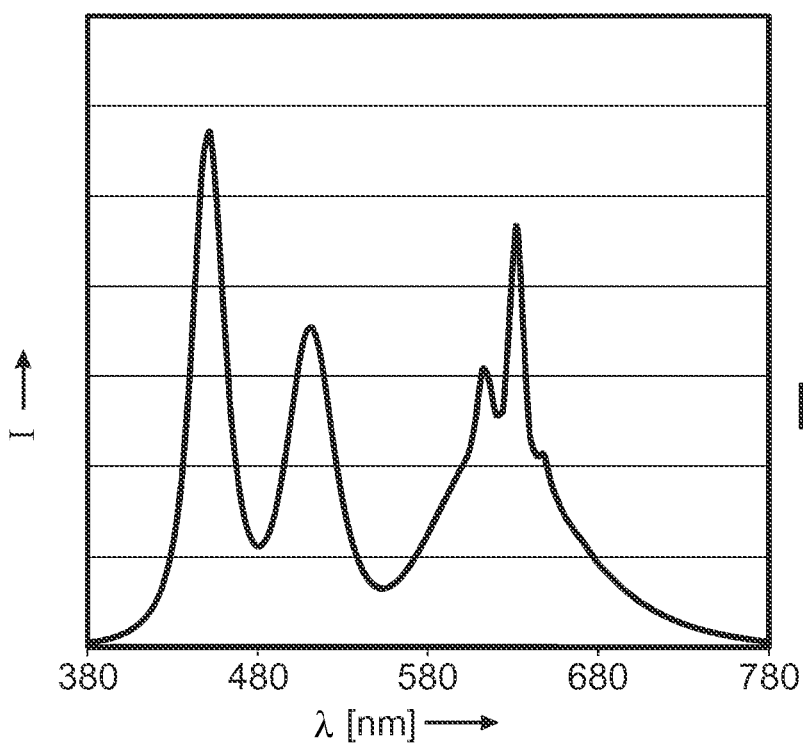

FIGS. 4a-4b: show with a 510 nm green LED, on the left (a) a chromaticity chart (CIE chromaticity diagram) and on the right 9b) an emission spectrum of backlight unit.

Figure 5A:
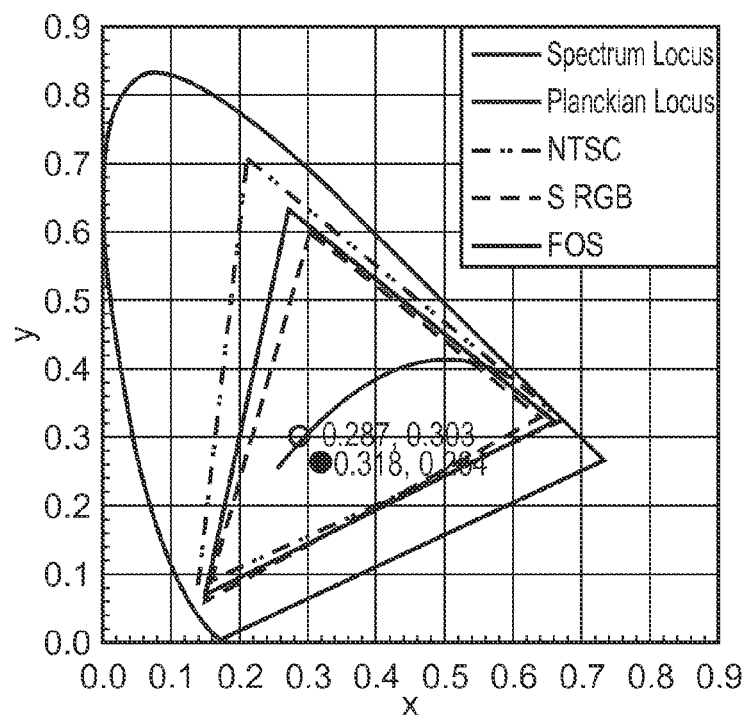
FIGS. 5*a*-5*b*: show with a 520 nm green LED, on the left (a) a chromaticity chart (CIE chromaticity diagram) and on the right 9*b*) an emission spectrum of backlight unit.
Figure 5B:
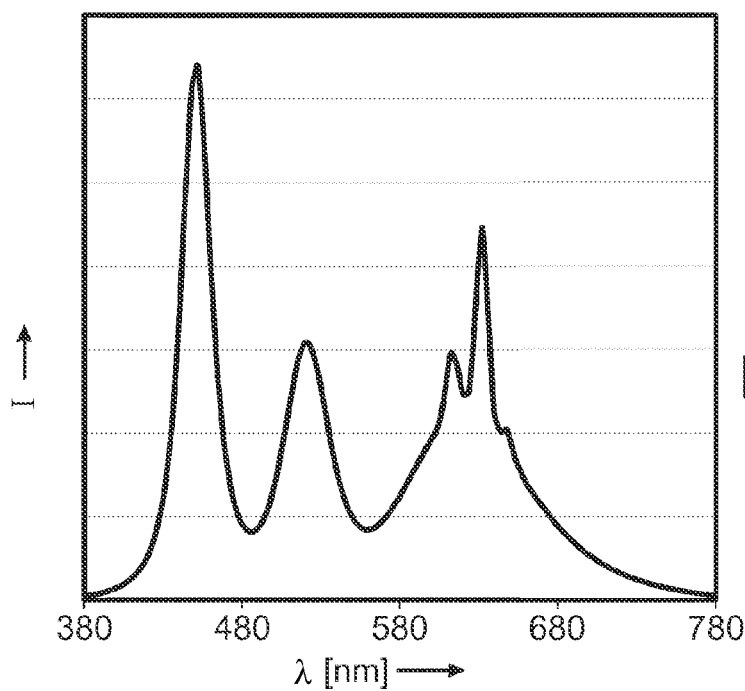

FIGS. 5a-5b: show with a 520 nm green LED, on the left (a) a chromaticity chart (CIE chromaticity diagram) and on the right 9b) an emission spectrum of backlight unit.

Figure 6A:
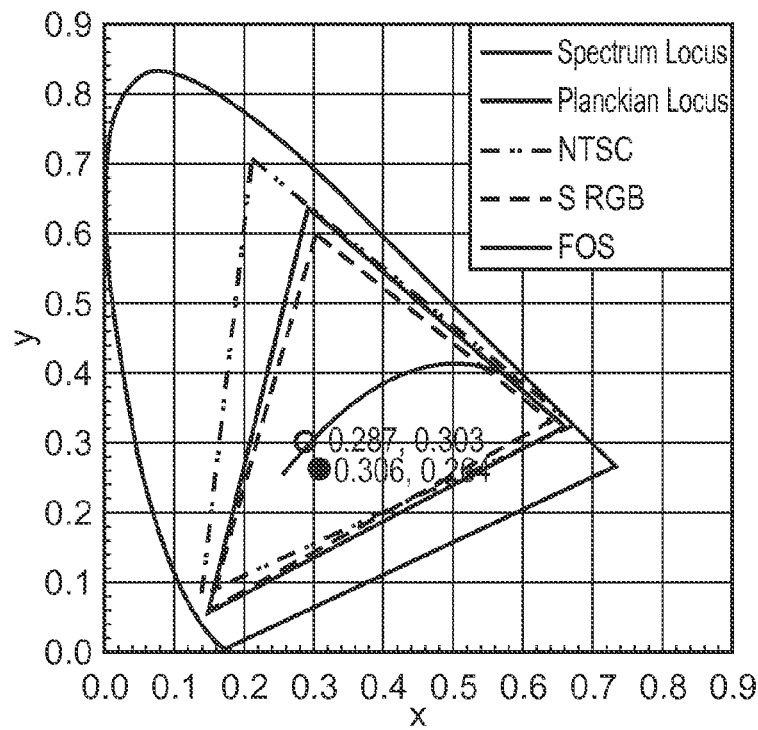
FIGS. 6*a*-6*b*: show with a 530 nm green LED, on the left (a) a chromaticity chart (CIE chromaticity diagram) and on the right 9*b*) an emission spectrum of backlight unit.
Figure 6B:
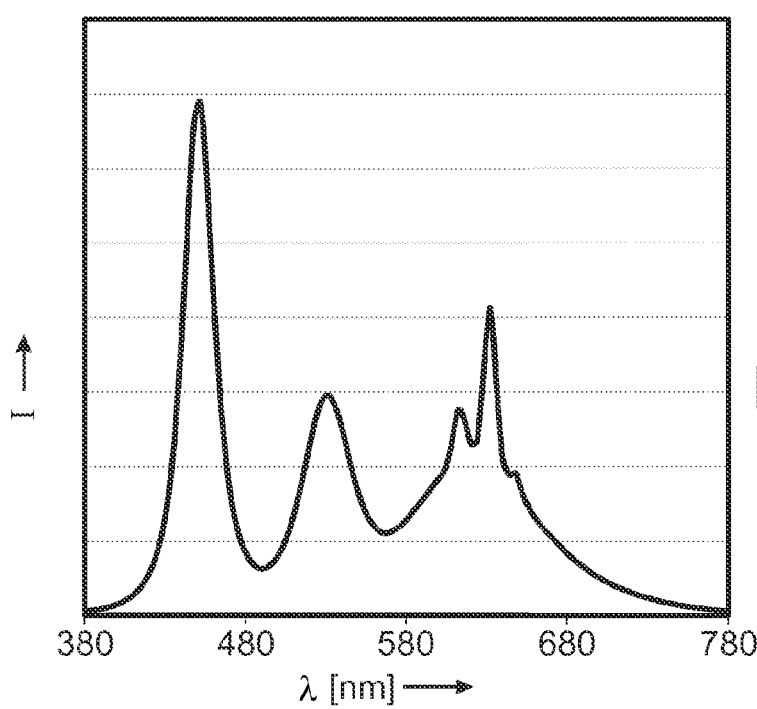

FIGS. 6a-6b: show with a 530 nm green LED, on the left (a) a chromaticity chart (CIE chromaticity diagram) and on the right 9b) an emission spectrum of backlight unit.

Figure 7A:
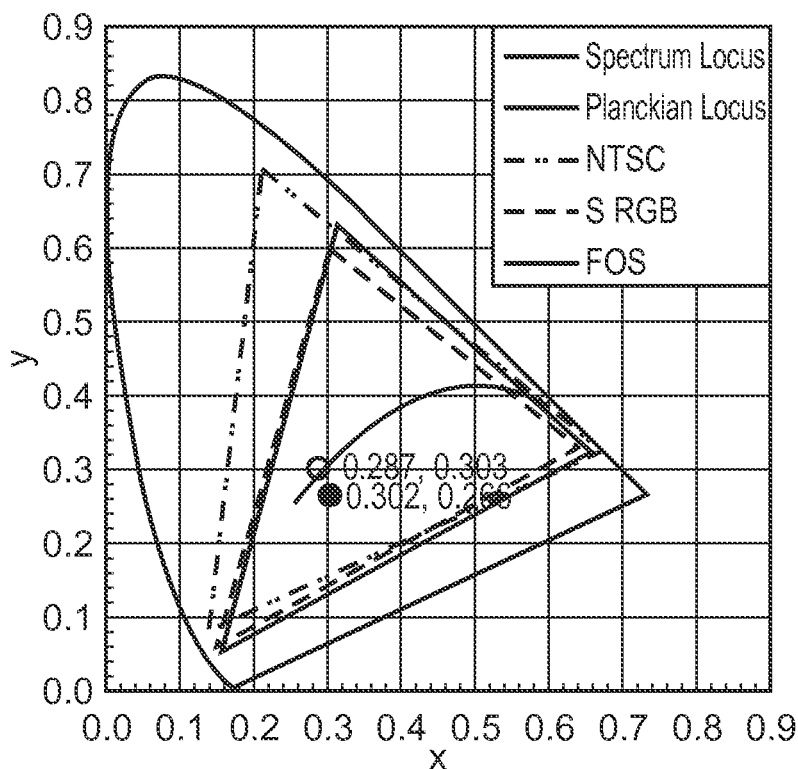
FIGS. 7*a*-7*b*: show with a 540 nm green LED, on the left (a) a chromaticity chart (CIE chromaticity diagram) and on the right 9*b*) an emission spectrum of backlight unit.
Figure 7B:
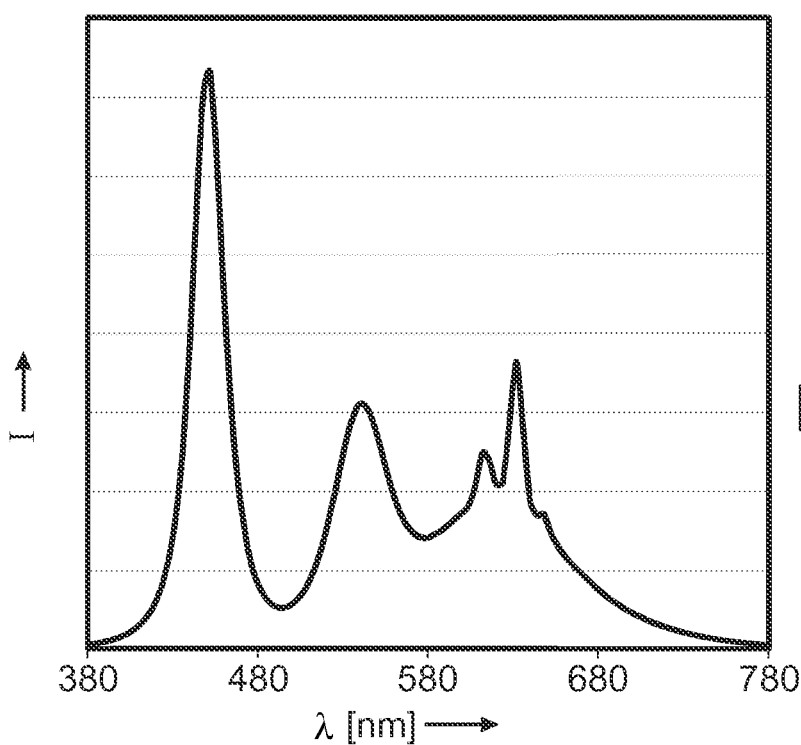

FIGS. 7a-7b: show with a 540 nm green LED, on the left (a) a chromaticity chart (CIE chromaticity diagram) and on the right 9b) an emission spectrum of backlight unit.

It appears that the lighting unit according to the invention gives a high NTSC value but also has a very good overlap with the NTSC color space, more than 5 percent better than all the reference examples.

Summarized, the following results were obtained:

TABLE 4

Area of the FOS color gamut relative to sRGB and NTSC definitions and
FOS lumen equivalent for 450 nm blue LED and different green LEDs:

| Green peak [nm] | sRGB | NTSC | LE [lm/W] | pr_redbroad | pr_green | pr_redKSiF | pr_blue |
|---|---|---|---|---|---|---|---|
| 510 | 108.19% | 76.63% | 241 | 40.69% | 24.19% | 5.64% | 29.47% |
| 520 | 113.99% | 80.74% | 255 | 39.11% | 22.62% | 5.43% | 32.84% |
| 530 | 114.18% | 80.87% | 269 | 36.64% | 22.99% | 4.99% | 35.38% |
| 540 | 110.12% | 77.99% | 282 | 32.81% | 25.30% | 4.30% | 37.60% |

Reference Example 4

The following combination was evaluated:
Green: direct emitting LED
Red phosphor: quantum dot phosphor with peak emission at 630 nm
Blue LED: 460 nm peak emission The FOS color gamut with backlight units using different direct green emitting LEDs of 510, 520, 530 and 540 nm peak, respectively, were evaluated. In below table the area of the FOS color gamut relative to sRGB and NTSC definitions and FOS lumen equivalent for 450 nm blue LED and different green LEDs is displayed.

TABLE 5 area of the FOS color gamut relative to sRGB and NTSC definitions and FOS lumen equivalent for 450 nm blue LED and different green LEDs

| Green peak [nm] | sRGB | NTSC | LE [lm/W] | pr_redbroad | pr_green | pr_redKSiF | pr_blue |
|---|---|---|---|---|---|---|---|
| 510 | 137.73% | 97.55% | 224 | 10.27% | 32.08% | 20.80% | 36.85% |
| 520 | 142.29% | 100.78% | 238 | 10.07% | 28.68% | 19.82% | 41.44% |
| 530 | 138.20% | 97.88% | 252 | 9.94% | 27.64% | 17.80% | 44.62% |
| 540 | 128.57% | 91.06% | 266 | 9.83% | 28.58% | 14.58% | 47.01% |

Example 3

Further, a combination according to the invention was evaluated:
Green: direct emitting LED
Red phosphor: Qdot with peak emission at 630 nm+red CASN phosphor, peak emission 620 nm
Blue LED: 460 nm peak emission The FOS color gamut with backlight units using different direct green emitting LEDs of 510, 520, 530 and 540 nm peak, respectively, were evaluated. In below table the area of the FOS color gamut relative to sRGB and NTSC definitions and FOS lumen equivalent for 450 nm blue LED and different green LEDs is displayed.

TABLE 6 area of the FOS color gamut relative to sRGB and NTSC definitions and FOS lumen equivalent for 450 nm blue LED and different green LEDs

| Green peak [nm] | sRGB | NTSC | LE [lm/W] | pr_redbroad | pr_green | pr_redQD | pr_blue |
|---|---|---|---|---|---|---|---|
| 510 | 118.52% | 83.94% | 237 | 9.86% | 27.38% | 23.71% | 39.05% |
| 520 | 122.76% | 86.95% | 249 | 9.68% | 24.62% | 22.79% | 42.91% |
| 530 | 121.73% | 86.22% | 260 | 9.54% | 24.08% | 20.88% | 45.49% |
| 540 | 117.08% | 82.93% | 270 | 9.42% | 25.53% | 17.71% | 47.34% |

Also here, it appears that the lighting unit according to the invention gives a high NTSC value but also has a very good overlap with the NTSC color space, more than 5 percent better than all the reference examples.

The invention claimed is:

1. A lighting unit comprising a source of blue light, a source of green light, a first source of red light comprising a first red luminescent material, arranged to provide red light with a broad band spectral light distribution, and a second source of red light comprising a second red luminescent material, arranged to provide red light with a spectral light distribution comprising one or more red emission lines.

2. The lighting unit according to claim 1, wherein the first source of red light is configured to provide red light with a broad band spectral light distribution having a centroid emission wavelength ≥590 nm and with a full width half maximum of ≥70 nm.

3. The lighting unit according to claim 1, wherein the first source of red light comprises said first red luminescent material selected from the group consisting of a divalent europium containing sulfide, a divalent europium containing nitride and a divalent europium containing oxynitride.

4. The lighting unit according to claim 1, wherein the first source of red light comprises said first red luminescent material, selected from the group consisting of $AlSiN_3$:Eu and $(Ba,Sr,Ca)_2Si_{5-x}Al_xO_xN_{8-x}$:Eu, wherein $0 \leq x \leq 4$.

5. The lighting unit according to claim 1, wherein the second source of red light is configured to provide red light with a spectral light distribution comprising one or more red emission lines having a centroid emission wavelength ≥610 nm and with one or more red emission lines having a full width half maximum (FWHM) of ≤6 nm.

6. The lighting unit according to claim 1, wherein the second source of red light comprises said second red luminescent material selected from the group consisting of $M_2AX_6$ doped with tetravalent manganese, wherein M comprises monovalent cations, selected from the group consisting of Li, Na, K, Rb, Cs, $NH_4$, wherein A comprises a tetravalent cation selected from the group consisting of Si, Ti, Ge, Sn, and Zr, and wherein X comprises a monovalent anion selected from the group consisting of F, Cl, Br and I, but at least comprising F.

7. The lighting unit according to claim 1, wherein the second source of red light comprises said second red luminescent material comprising $K_2SiF_6$:Mn.

8. The lighting unit according to claim 1, wherein the second source of red light comprises said second red luminescent material comprising a light converter nano particle material.

9. The lighting unit according to claim 1, wherein the source of blue light comprises a blue light emitting diode.

10. The lighting unit according to claim 1, wherein the source of green light comprises a luminescent material that is configured to convert at least part of the blue light of the source of blue light, and to convert said blue light into green light.

11. The lighting unit according to claim 1, wherein the source of green light comprises a luminescent material comprising $M_3A_5O_{12}:Ce^{3+}$, wherein M is selected from the group consisting of Sc, Y, Tb, Gd, and Lu and wherein A is selected from the group consisting of Al and Ga.

12. The lighting unit according to claim 1, wherein the source of green light comprises a LED with a centroid emission wavelength in the range of 510-540 nm.

13. The lighting unit according to claim 1, wherein the source of blue light comprises a blue light emitting diode, wherein the source of green light comprises a LED with centroid emission wavelength in the range of 510-540 nm, wherein the first source of red light comprises the first red luminescent material, selected from the group consisting of $(Mg,Ca,Sr,Ba)AlSiN_3:Eu$ and $(Ba,Sr,Ca)_2Si_{5-x}Al_xO_xN_{8-x}:Eu$, wherein $x=0\leq x\leq 4$, and wherein the second source of red light comprises said second red luminescent material comprising $K_2SiF_6:Mn$.

14. An LCD display device comprising the lighting unit according to claim 1 configured as backlighting unit.

15. A combination of phosphors comprising a green luminescent material selected from the group consisting of a divalent europium containing oxynitride, a divalent europium containing thiogallate, a trivalent cerium containing nitride, a trivalent cerium containing oxynitride, and a trivalent cerium containing garnet, a first red luminescent material, selected from the group consisting of, $(Mg,Ca,Sr,Ba)AlSiN_3:Eu$ and $(Ba,Sr,Ca)_2Si_{5-x}Al_xO_xN_{8-x}:Eu$, wherein $0\leq x\leq 4$, and a second red luminescent material selected from the group consisting of $M_2AQ_6$ doped with tetravalent manganese, wherein M comprises monovalent cations, selected from the group consisting of Li, Na, K, Rb, Cs, $NH_4$, wherein A 20 comprises a tetravalent cation selected from the group consisting of Si, Ti, Ge, Sn, and Zr, and wherein Q comprises a monovalent anion selected from the group consisting of F, Cl, Br and I, but at least comprising F.

* * * * *